United States Patent [19]

Stahlhofen

[11] Patent Number: 4,642,282
[45] Date of Patent: Feb. 10, 1987

[54] LIGHT-SENSITIVE POSITIVE COPYING MATERIAL WITH ALKALI SOLUBLE POLYCONDENSATION BINDER

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 622,446

[22] Filed: Jun. 20, 1984

[30] Foreign Application Priority Data

Jun. 29, 1983 [DE] Fed. Rep. of Germany ....... 3323343

[51] Int. Cl.⁴ .................... G03C 1/60; G03C 1/94; G03F 7/08
[52] U.S. Cl. .................... 430/165; 430/189; 430/192; 430/270; 430/271; 430/278; 430/302; 430/309; 430/330
[58] Field of Search ............... 430/192, 189, 175, 165, 430/278, 270, 271, 302

[56] References Cited

U.S. PATENT DOCUMENTS

| | | | |
|---|---|---|---|
| 3,201,239 | 8/1965 | Neugebauer et al. | 96/36 |
| 3,849,392 | 11/1974 | Steppan | 430/175 |
| 3,890,152 | 6/1975 | Ruckert et al. | 430/175 |
| 4,288,520 | 9/1981 | Sprintschnik | 430/175 |
| 4,477,553 | 10/1984 | Yamamoto et al. | 430/192 |
| 4,510,227 | 4/1985 | Mohr et al. | 430/192 |

FOREIGN PATENT DOCUMENTS

| | | |
|---|---|---|
| 0021718 | 1/1981 | European Pat. Off. . |
| 0054258 | 6/1982 | European Pat. Off. . |
| 1150203 | 4/1969 | United Kingdom . |

*Primary Examiner*—Charles L. Bowers, Jr.
*Attorney, Agent, or Firm*—Schwartz, Jeffery, Schwaab, Mack, Blumenthal & Evans

[57] ABSTRACT

A light-sensitive mixture is disclosed which contains a binder comprising a polycondensation product of a phenol corresponding to the formula

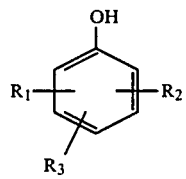

wherein
$R_1$ is a hydrogen atom, an alkyl group or a hydroxy group,
$R_2$ is a hydrogen atom, an alkyl group, a hydroxy group or an acetyl group, and
$R_3$ is a hydrogen atom or a halogen atom, an alkyl group, an alkoxy group, a carboxyl group or a carboxylic acid ester group, and a compound corresponding to the formula $$ROCH_2-X-CH_2OR,$$

wherein
R is a hydrogen atom, a methyl group, an ethyl group or an acetyl group and
X is a phenylene group or a binuclear aromatic group.

The mixture yields printing plates which have a high resistance to developing solutions and which show a low degree of soiling upon baking.

19 Claims, No Drawings

LIGHT-SENSITIVE POSITIVE COPYING MATERIAL WITH ALKALI SOLUBLE POLYCONDENSATION BINDER

BACKGROUND OF THE INVENTION

The present invention is concerned with a light-sensitive mixture composed of a binder and a light-sensitive compound, or a light-sensitive combination of compounds, which undergoes a change of solubility in an aqueous-alkaline solution upon exposure to light. The invention is also concerned with a light-sensitive copying material comprising a support and a light-sensitive layer which is comprised of the above-indicated mixture.

Mixtures of the above-mentioned type, which contain positive-acting o-quinone diazides as the light-sensitive compounds and which are preferably used in the production of printing plates, are disclosed, for example, in German Pat. No. 1,195,166 (corresponding to U.S. Pat. No. 3,201,239). These known mixtures contain phenol-formaldehyde novolaks or cresol-formaldehdye novolaks as the binders.

In Published European Patent Application No. 021,718 and No. 054,258, novolaks which have been prepared by reacting substituted resorcinol derivatives with aldehydes or ketones are described for use as binders in mixtures of the aforementioned type.

Planographic printing forms which have been prepared from light-sensitive planographic printing plates based on such mixtures have the advantage of yielding large print runs. The printing stencil of such a printing form, however, shows a certain susceptibility to the action of dampening solutions containing alcohol, which are now frequently used. As a consequence, the printing stencil is attacked and the print run is reduced. In addition, resistance to aqueous-alkaline developing solutions and gasoline solvents, of the kind employed during copying operations or on printing presses, is insufficient in some cases.

Print run and resistance to chemicals of such printing stencils may be further increased by baking at temperatures above 200° C., but due to baking residues from the layer, which develop in the non-image areas, this operational step requires an additional pre-treatment or post-treatment of the printing forms and thus involves an additional expenditure of work.

Novolaks prepared from phenols and aldehydes or ketones, respectively, also have the disadvantage of a relatively high brittleness, which has an unfavorable effect, especially in the processing of comparatively thick copying layers, for example, photoresist layers.

SUMMARY OF THE INVENTION

It is therefore an object of the present invention to provide a light-sensitive mixture, especially useful for the production of planographic printing plates, which yields copying layers of higher flexibility and which can be baked without the need for a pre-treatment or post-treatment of the printing form.

According to the invention, a light-sensitive mixture is provided, which undergoes a change of solubility in an aqueous-alkaline solution upon exposure to light and which contains a light-sensitive compound or a light-sensitive combination of compounds and a binder which is insoluble in water and soluble in aqueous-alkaline solutions.

In the mixture of the present invention, the binder comprises a polycondensation product of a phenol corresponding to the general formula

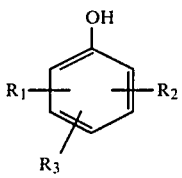

wherein
$R_1$ is a hydrogen atom, an alkyl group or a hydroxy group,
$R_2$ is a hydrogen atom, an alkyl group, a hydroxy group or an acetyl group, and
$R_3$ is a hydrogen atom, a halogen atom, an alkyl group, an alkoxy group, a carboxyl group, or a carboxylic acid ester group, and a compound corresponding to the general formula $$ROCH_2-X-CH_2OR,$$

wherein
R is a hydrogen atom, a methyl group, an ethyl group or an acetyl group and
X is a phenylene group or a divalent aromatic group which comprises two phenylene groups linked by a single bond, an ether group, a sulfide group, a sulfone group, or an alkylene group, and which may be unsubstituted or substituted.

Phenols having more than two H atoms which are capable of being activated can readily form crosslinked products, in which one phenol component may possibly even be linked to more than two $CH_2-X-CH_2$ members. For this reason, those of the monohydric phenols are preferred, in which at least one o-position of the p-position is occupied. Polyhydric phenols should have no more than two activated nuclear positions which are free.

Phenols which are suitable for synthesizing the binders according to the present invention include, for example: 4-t-butyl-phenol, 4-methyl-phenol, 4-hydroxybenzoic acid, 3,4-dimethyl-phenol, 2-methyl-resorcinol, 2-ethyl-resorcinol, 2-hexyl-resorcinol, 2-methyl-5-chloro-resorcinol, 2,5-dimethyl-resorcinol, 2,5-diethyl-resorcinol, 4-methyl-resorcinol, 4-hexyl-resorcinol, 4-acetyl-resorcinol, 5-methyl-pyrogallol, 5-t-butyl-pyrogallol, 2,4-dihydroxy-benzoic acid, 2,4-dihydroxy-benzoic acid-methylester, 2,4-dihydroxy-benzoic acid-ethylester, 3,4,5-trihydroxy-benzoic acid, 3,4,5-trihydroxy-benzoic acid-methylester, 3,4,5-trihydroxy-benzoic acid-ethylester, 3,4,5-trihydroxy-benzoic acid-propylester.

Compounds which correspond to the formula $ROCH_2-X-CH_2OR$ are known, and are described, for example, in U.S. Pat. No. 3,849,392, for use as condensing reactants with aromatic diazonium salts. In the aforementioned patent, a great number of compounds are described which are also suitable as condensing reactants within the scope of the present invention. Particularly preferred are compounds in which R is a methyl group and those in which X is the radical of a diphenylether, a diphenylsulfide, a diphenyl, a diphenylmethane or a diphenylsulfone, which may be unsubstituted or substituted. The free valencies of the arylene groups X are preferably in the 1,4- or in the 4,4'-position, respectively. If X is the radical of a diphenylalkane, the alkane group has from 1 to 6 carbon atoms, preferably from 1 to 3 carbon atoms.

Examples of suitable compounds corresponding to the formula ROCH$_2$—X—CH$_2$OR are:
bis-(methoxymethyl)-diphenylether,
bis-(methoxymethyl)-benzene,
bis-(hydroxymethyl)-benzene,
bis-(methoxymethyl)-diphenylsulfide,
bis-(methoxymethyl)-diphenyl,
bis-(acetoxymethyl)-diphenylmethane,
bis-(hydroxymethyl)-diphenylsulfone,
in particular, the corresponding 4,4'-isomers.

The condensation reaction which is carried out to prepare the binders of the present invention is run in the presence of a strongly acidic condensing agent. Suitable condensing agents are, for example, methane-sulfonic acid (90 to 99% strength), concentrated hydrochloric acid, concentrated sulfuric acid, phosphoric acid (85% strength), phosphorus oxychloride, diethyl sulfate or chlorosulfonic acid.

The condensation reaction is advantageously carried out in a homogeneous reaction medium, since such a medium is the most convenient for obtaining reproducible results. If the phenolic component is already soluble in the co-reactant, a further solvent can optionally be dispensed with.

Otherwise, xylene, dioxane, toluene, 2-methoxyethylacetate, 1,2-dimethoxyethane or ethanol are preferably employed as solvents.

The temperature range which is preferred in the preparation of the condensation products is from +10° to 150° C.

The condensation reactions proceed surprisingly smoothly and, in many cases, virtually quantitatively, even under very mild conditions. It is to be assumed that, in the performance of the condensation reaction, the bis-(methoxymethyl) compounds preferably completely or partly react with the phenolic component, with an intramolecular elimination of methanol taking place in the process. If an excessive amount of, for example, 4,4'-bis-(methoxylmethyl)diphenylether is present, the latter may also react with itself to form condensation products.

In principle, it is possible also to produce mixed condensation products of any composition, for example, mixed condensation products comprising different phenolic components.

The solubility and the average molecular weights of the condensation products may vary widely, depending on the choice of the participants in the condensation reaction and on the experimental conditions. In the case of phenol components having more than two H atoms which are capable of being activated, crosslinking reactions occur easily which extensively affect the solubility and the properites of the final condensation products. Thus, the nonsubstituted phenols, such as pyrogallol, resorcinol and phenol, react very strongly with the above-indicated 4,4'-bis-(methoxymethyl) compounds in the presence of acid condensing agents, forming resinous crosslinked polycondensation products which are normally unsuitable for use as binders according to the present invention, since they frequently have a very low solubility. In addition, the conditions of reaction, for example, temperature and time of reaction, and particularly type and quantity of the acid condensing agent used, have a great influence on the solubility of the condensation products formed. If very small quantities of condensing agent are used, condensation products which have a relatively low molecular weight and often show a soft consistency are usually obtained. Condensation products which have molecular weights between 600 and 10,000 have proved to be particularly suitable for preparing good copying materials.

The condensation products of the present invention have good film-forming properties and the copying layers produced with these condensation products show a flexibility which is improved over that of layers comprising novolaks prepared with phenol-formaldehyde, they have a harder gradation and, in many cases, a good resistance to chemicals and to various etchants.

In the text which follows, examples of syntheses of condensation products according to the present invention are given:

Synthesis 1

24.8 g of 2-methyl-resorcinol were dissolved in 51.6 g of 4,4'-bis-(methoxymethyl)-diphenylether (hereinafter ("MMDPO") at an elevated temperature and 1 ml of diethylsulfate are added to the solution. The reaction solution was slowly heated to 110° C. during stirring. After about 5 to 10 minutes condensation starts, often with a vigorous reaction. The methanol which was produced in the process was removed with the aid of a descending condenser. In the course of the condensation reaction, the viscosity of the reaction solution increased substantially, and after about 15 minutes the condensation product was deposited in a solid form in the reaction flask. The condensation product has a melting range from 110° to 150° C. (decomp.).

Synthesis 2

24.8 g of 2-methyl-resorcinol were dissolved in 52 g of MMDPO, at an elevated temperature. After cooling to room temperature, 20 ml of concentrated hydrochloric acid were added and the reaction solution was then stirred for 2 to 3 hours. Condensation proceeded via a slightly exothermic reaction and, in the process, viscosity increased continuously. When the condensation product had completely solidified, it was crushed, washed well with water, and dried in vacuo (about 50 mbar) at 30° to 40° C. The light yellow reaction product had a melting range from 100° to 140° C. (decomp.).

Synthesis 3

130.2 g of 2-methyl-resorcinol were dissolved in 200 ml of 1,2-dimethoxyethane and after the addition of 1 ml of methane-sulfonic acid, the solution was heated to 130° C. When the reaction solution had reached this temperature, 258.3 g of MMDPO were slowly added dropwise, with thorough stirring. After a short period, condensation started with the elimination of methanol which was distilled off from the of MMDPO, which . Following the addition took about 60 minutes, the reaction solution which was thoroughly stirred was maintained at 130° C. for 90 minutes and during this period the viscosity increased gradually. Upon completion of the condensation reaction, about 78 ml of distillate were obtained. The reaction solution was then cooled, diluted with 100 ml of 1,2-dimethoxyethane and slowly poured into 6 to 7 liters of ice water, in the form of a jet which was as thin as possible and with vigorous stirring. In the process, a light yellow condensation product was precipitated. Stirring was continued for 1 hour and, thereafter, the condensation product was filtered off by suction and thoroughly washed with water. Advantageously, the condensate was again suspended in 6 to 7 liters of water, stirred well for 1 hour and filtered off by suction. After drying in air, the condensation product had a melting range from 60° to 90° C.

Synthesis 4

24.8 g of 2,4-dihydroxy-toluene were dissolved in 52 g of MMDPO, at an elevated temperature. After adding 5 ml of phosphorus oxychloride, the reaction vessel was allowed to stand at room temperature for 24 hours with light stirring, and the solution was then poured into 3 liters of ice water, with vigorous stirring. In the process, the condensation product, which had a yellowish-orange color, was precipitated in a solid form. The condensation product was washed free from acid and dried in vacuo at 30° to 40° C. Melting range: from 90° to 110° C.

Synthesis 5

A condensation product which was identical to that obtained according to Synthesis 4 resulted when a solution of 24.8 g of 2,4-dihydroxy-toluene and 52 g of MMDPO in 50 ml of xylene was heated during 1 hour to 120° C. while stirring well, in the presence of 1 ml of methane-sulfonic acid which served as a condensing agent. The methanol which was produced in the process was distilled off with the aid of a descending condenser. After condensation, the still hot reaction mixture was poured into a dish and was allowed to cool. The solidified condensation product was crushed and thoroughly washed twice with gasoline, in order to remove the remaining xylene. The reddish-brown condensation product had a melting range from 90° to 120° C. (decomp.).

Synthesis 6

A solution of 39.6 g of gallic acid ethylester and 52 g of MMDPO in 50 ml of ethanol was kept boiling for 2 hours during stirring, in the presence of 10 ml of concentrated hydrochloric acid. After cooling, the viscous reaction solution was poured into 3 liters of ice water, with vigorous stirring. The condensation product was precipitated in a solid form. It was washed free from acid and dried in vacuo at 30° to 40° C. The melting range was above 300° C.

Synthesis 7

Molar quantities of 4-t-butylphenol and MMDPO were slowly heated to 120° C., in the presence of 0.5 ml of chlorosulfonic acid. After a short period, condensation started with a vigorous reaction and with the elimination of methanol, and the originally clear solution solidified to form an elastic condensation product.

As far as preparation was concerned, it was more appropriate to run this condensation reaction as follows: 30 g of 4-t-butyl-phenol were dissolved in 52 g of MMDPO and 50 ml of xylene and heated to 115° C., during thorough stirring, in the presence of 1 ml of methane-sulfonic acid. At a temperature of 110° C., condensation started, with methanol being eliminated which was distilled off with the aid of a descending condenser. After 30 minutes, the reaction temperature was raised to 140° C. As soon as the distillation of methanol had stopped, the reaction mixture was cooled to about 50° C. and poured into 1 liter of gasoline, with vigorous stirring. In the gasoline, the condensation product was gradually deposited in a solid form. Melting range: from 80° to 120° C. (decomp.).

Synthesis 8

A solution of 30.4 g of 2,4-dihydroxy-acetophenone and 52 g of MMDPO was kept boiling for 3 hours during stirring, in the presence of 20 ml of concentrated hydrochloric acid. Thereafter, the reaction solution was mixed by stirring with 3 liters of ice water and, in the process, the condensation product was precipitated in the form of a soft resin. It was washed free from acid and dehydrated in vacuo at 30° to 40° C.

Synthesis 9

A solution of 36.4 g of 2,4-dihydroxy-benzoic acid ethylester, 52 g of MMDPO, and 100 g of xylene was admixed with 1 ml of methane-sulfonic acid and slowly heated to 115° to 120° C., with thorough stirring. The methanol which was produced in the condensation reaction was distilled off with the aid of a descending condenser. Upon completion of the separation of methanol, the reaction solution was briefly heated to about 138° C., until the boiling point of the distillate had adjusted to the internal temperature. After cooling, the reaction solution was stirred into gasoline. The condensation product, which was initially precipitated in a viscous form, solidified after prolonged stirring. In order to remove the remaining xylene, the dried yellow condensation product was additionally washed twice with gasoline. Melting range: from 110° to 140° C. (decomp.).

Synthesis 10

A solution of 27.3 g of 2-methyl-resorcinol and 33.2 g of bis-(methoxymethyl)-benzene in 50 ml of xylene was slowly heated to 125° C., with thorough stirring, in the presence of 1 ml of methane-sulfonic acid. At a temperature of about 110° C., condensation started with methanol being eliminated which was distilled off with the aid of a descending condenser. The reddish-brown condensation product began to separate from the reaction solution. After one hour, the elimination of methanol had ended. The temperature was briefly raised at 135° to 138° C., until xylene began to be distilled off. The reaction mixture was allowed to cool, and the deeply orange-colored condensation product which had been precipitated was removed by suction, thoroughly washed with gasoline, and, after drying, stirred well in 1 liter of water to remove any non-reacted 2-methyl-resorcinol. After drying, the condensation product melted at 260° C. and was decomposed in the process.

Synthesis 11

6.2 g of 2-methyl-resorcinol were dissolved in 40 ml of dioxane and admixed with 3 ml of phosphorus oxychloride. To this solution, which had been brought to boiling heat and was stirred well, a solution of 13.9 g of 4,4'-bis-(hydroxymethyl)-diphenylsufone in 60 ml of dioxane was added dropwise. The reaction solution was kept boiling for 2 hours. After cooling, the reddish-brown solution was mixed by stirring with 1 liter of gasoline, the condensation product being initially precipitated in the form of a soft resin. This soft resin was stirred in water, until it had solidified. After drying in a vacuum drying cabinet at about 40° C., the yellow condensation product had a melting range from 90° to 120° C. (decomp.).

Synthesis 12

24.8 g of 2,4-dihydroxy-toluene were dissolved in 50 ml of ethanol and admixed with 10 ml of concentrated hydrochloric acid, and the solution was then condensed with 52 g of MMDPO, at boiling heat, as described in Synthesis 10. The yellow condensation product had a melting range from 110° to 140° C.

Synthesis 13

A solution of 30 g of 4-t-butyl-phenol in 39 g of 4,4'-bis-(methoxymethyl)-benzene (85% strength) was kept boiling for 1 hour in the presence of 2 ml of methane-sulfonic acid. Upon completion of the condensation reaction, the reaction solution, which had cooled to room temperature, was poured into 3 liters of ice water with vigorous stirring; in the process, the condensation product was first precipitated in the form of a colorless soft resin, which gradually solidified upon prolonged stirring. Melting range: from 70° to 100° C.

Synthesis 14

18.9 g of phenol were dissolved in 51.6 g of MMDPO and admixed with 5 ml of phosphorus oxychloride. With the repeated shaking of the reaction solution, condensation was allowed to proceed at room temperature. The solution gradually warmed up and, after about 30 minutes, a higher-molecular weight condensation product which was insoluble in organic solvents had formed in a vigorous reaction. Resorcinol and pyrogallol behaved similarly to phenol in this context.

4,4'-bis-(methoxymethyl)-benzene), 4,4'-bis-(methoxymethyl)-diphenyl, 4,4'-bis-(methoxymethyl)-diphenylmethane, and 4,4'-bis-(methoxymethyl)-diphenysulfide are similar to MMDPO in their reactions with the indicated phenols.

The concentration of the condensation product in the light-sensitive mixture may vary very widely, depending on the nature of the light-sensitive system. In general, the condensation product is present in a quantity ranging between about 10 to 95%, preferably between about 40 and 80% by weight, relative to the mixture of non-volatile constitutents in the light-sensitive mixture.

Additionally, the light-sensitive mixtures according to the invention contain a light-sensitive compound or a light-sensitive combination of compounds. Positive-acting copounds (i.e., those which are rendered soluble by exposure, are most suitable for the purpose of the present invention. They include o-quinone-diazides and combinations of photolytic acid donors and compounds which can be split by acid, such as ortho-carboxylic acid compounds and acetal compounds. Moreover, p-quinone diazides and diazonium salt polycondensation products are suitable light-sensitive compounds.

The mixture and process according to the invention have particular advantages in connection with light-sensitive materials based on o-quinone-diazides, since in this case a particularly large increase in the print run is obtained by baking. Suitable materials of this type are known and described, for example, in German Pat. No. 938,233 and in German Offenlegungsschriften No. 2,331,377, No. 2,547,905 and No. 2,828,037. The preferred o-quinone-diazides are naphthoquinone-(1,2)-diazide-(2)-4- or 5-sulfonic acid esters or amides. Among these, esters, in particular those of the 5-sulfonic acid, are particularly preferred. In general, the quantity of o-quinone-diazide compounds is about 3 to 50% by weight, preferably about 7 to 35% by weight, relative to the non-volatile constituents of the mixture.

Materials based on compounds which can be split by acid can also be baked with good effect and used in the process according to the present invention.

Copying materials of this type are known and described, for example, in U.S. Pat. No. 3,779,778 and No. 4,101,323, in German Pat. No. 2,718,254 and in German Offenlegungsschriften No. 2,829,512 and No. 2,829,511. As the compounds which can be split by acid, they contain ortho-carboxylic acid derivatives, monomeric or polymeric acetals, enol ethers or acyliminocarbonates. As the compounds which are sensitive to radiation and which eliminate acid, they predominantly contain organic halogen compounds, in particular s-triazines or 2-trichloromethyl-1,3,4-oxadiazoles which are substituted by halogenomethyl groups.

Among the ortho-carboxylic acid derivatives described in U.S. Pat. No. 4,101,323, the bis-1,3-dioxan-2-yl ethers of aliphatic diols are particularly used.

Among the polyacetals described in German Pat. No. 2,718,254, those with aliphatic aldehyde units and diol units are preferred.

Further, very suitable mixtures are described in German Offenlegungsschrift No. 2,928,636. In the latter, polymeric ortho-esters with recurrent ortho-ester groups in the main chain are described as compounds which can be split by acid. These groups are 2-alkyl ethers of 1,3-dioxa-cycloalkanes having 5 or 6 ring members. Polymers with recurrent 1,3-dioxa-cyclohex-2-yl alkyl ether units, in which the alkyl ether group can be interrupted by ether oxygen atoms and is preferably bonded to the 5-position of the adjacent ring, are particularly preferred.

The quantitative proportion of the compounds which can be split by acid in the light-sensitive mixture is in general between about 8 and 65% by weight, preferably between about 14 and 44% by weight, relative to the non-volatile constituents of the mixture. The quantity of the compound which eliminates acid is between about 0.1 and 10% by weight, preferably between about 0.2 and 5% by weight.

Together with the above-described phenol condensation products, a great number of other resins may additionally be used in the mixtures according to the present invention, preferably including vinyl polymers, such as polyvinyl acetates, polyacrylates, polyvinylethers, polyvinyl acetals, polyvinyl pyrrolidones and copolymers of the monomers on which these resins are based.

Other suitable binders which are soluble or swellable in alkaline media include natural resins, such as shallac and colophony, and synthetic resins, such as copolymers of styrene and maleic anhydride or copolymers of acrylic acid or methacrylic acid, in particular with acrylates of methacrylates and also novolaks. The most advantageous proportion of these resins depends on the technological requirements and on the influence on the developing conditions. To meet special requirements, such as flexibility, adhesion, gloss, coloration and color change, and the like, the light-sensitive mixture can additionally contain small amounts of substances, for example polyglycols, cellulose derivatives, such as ethylcellulose, surfactants, dyes, adhesion-promoters and finely divided pigments, and UV absorbers, if required.

For coating a suitable support, the mixtures are generally dissolved in a solvent. The selection of the solvents should be matched to the coating process, the layer thickness, and the drying conditions anticipated. Suitable solvents for the mixture according to the invention are ketones, such as methyl ethyl ketone; chlorinated hydrocarbons, such as trichloroethylene and 1,1,1-trichloroethane; alcohols, such as n-propanol; ethers such as tetrahydrofuran, alcohol-ethers, such as ethylene glycol monoethyl ether; and esters, such as butyl acetate. It is also possible to use mixtures which, for special purposes, can also contain solvents, such as acetonitrile, dioxane or dimethylformamide. In principle, any solvent can be used which does not irreversibly react with the layer components.

In most cases the supports used for layer thicknesses of less than about 10 μm are metals. The following may be used for offset printing plates: millfinished, mechanically or electrochemically roughened aluminum which, if desired, has been anodically oxidized and which additionally can also have been chemically pretreated, for example, with polyvinylphosphonic acid, silicates, hexafluorozirconates, hydrolyzed tetraethyl orthosilicate or phosphates.

Coating of the support material is carried out in a known manner by spin-coating, by spraying, by dipping, by means of rollers or slot dies, by blade-spreading, or by means of coater application.

Light sources customary in industry are used for exposure. Irradiation with electrons or a laser is another possibility for producing an image.

The aqueous-alkaline solutions used for developing, which can have graduated alkalinity, that is, they have a pH which preferably is between 10 and 14, and which can also contain minor amounts of organic solvents or surfactants, remove those areas of the copying layer which have been struck by light, thus producing a positive image of the original. Similar developers can be used for developing negative-acting layers.

The preferred use of the light-sensitive mixtures according to the present invention is in the preparation of printing forms, in particular offset printing forms, using aluminum as the support. The light-sensitive mixtures of the invention can also advantageously be used as photoresist materials, for example, in the preparation of printed circuits and integrated circuits, and for similar purposes.

After developing, the printing form can be heated in a known manner. The baking temperatures selected can be in the range from about 180° to 240° C., heating times of 1 to 20, preferably 5 to 10, minutes being normally required. If the support material is stable at higher temperatures, it is also possible to bake at temperatures above 240° C. and to select correspondingly shorter heating times.

The mixture according to the present invention and the light-sensitive copying material prepared therewith have the advantage that practically no baking residues remain in the non-image areas of the support after baking of the finally developed printing forms. It is therefore possible to dispense with an additional application of a water-soluble protective layer prior to baking or a subsequent removal of residues by treating with a developing solution. This advantage is not achieved when phenol-formaldehyde or cresol-formaldehyde condensation products are used as binders in a light-sensitive mixture.

The invention is explained in more detail by reference to the examples which follow, wherein parts by weight (p.b.w.) are related to parts by volume (p.b.v.) as g to $cm^3$. Unless otherwise stated, percentages are percent by weight.

EXAMPLE 1

An electrochemically roughened and anodically oxidized aluminum plate was coated with a solution of
2.00 p.b.w. of the esterification product obtained from 1 mole of 2,3,4-trihydroxy-benzophenone and 3 moles of naphthoquinone-(1,2)-diazide-(2)-5-sulfonic acid chloride,
4.00 p.b.w. of the condensation product according to Synthesis 3 above,
0.20 p.b.w. of naphthoquinone-(1,2)-diazide-(2)-4-sulfonic acid chloride, and
0.12 p.b.w. of crystal violet, in
40 p.b.w. of ethylene glycol monomethyl ether and
60 p.b.w. of tetrahydrofuran.

Before applying the light-sensitive copying layer, the anodically oxidized support had been treated with an aqueous solution of 0.1% by weight polyvinylphosphonic acid.

The presensitized material so prepared, having a layer weight of about 2.0 $g/m^2$, was imagewise exposed under a transparent positive original and then developed with a 5% strength aqueous solution of sodium metasilicate.$9H_2O$.

The areas of the copying layer which had been struck by light were removed by developing and the unexposed image areas remained on the support, so that a printing stencil corresponding to the original was obtained. Using an offset printing press, it was possible to obtain 150,000 impeccable prints from the printing form prepared in this manner.

The printing stencil had the advantages of an excellent resistance to the developing solution and a good adhesion to the support. In addition, the copying layer had a remarkably good resistance to chemicals of the kind normally used on printing presses, for example, to acid dampening solutions containing alcohols or to rinsing agents containing gasoline, in the course of the printing operation. It must also be pointed out that the copying layer yielded a relatively steep gradation, which is desirable in the practice of printing, as is known, since it provides advantages relating to copying technique.

If a phenol-formaldehyde novolak or the condensation product obtained from 2-methyl-resorcinol and formaldehyde is substituted for the binder used in Example 1, and an electrochemically roughened and anodically oxidized aluminum plate is coated with this solution, and is further processed according to Example 1, a printing stencil is obtained which displays, by way of comparison, a substantially lower resistance to chemicals and developing solutions and a shorter print run.

In order to increase the print run and strengthen the printing stencil, the printing form was subjected to a heat treatment. For this purpose, the developed and dried printing form was heated in a baking oven at 220° C. for five minutes.

By heating the printing form in the oven, the printing stencil was strengthened and the layer became resistant to chemicals, for example deletion fluids, and insoluble in organic solvents, such as acetone, alcohols, toluene or xylene. After heating, the printing form was inked with printing ink and contacted with dampening solution, without any further treatment. 250,000 flawless copies were obtained on an offset printing press.

If the binder composed of 2-methyl-resorcinol and MMDPO used in Example 1 is replaced by the same quantity of a phenol-formaldehyde novolak or a cresol-formaldehyde novolak and the correspondingly prepared printing forms are baked, severe scum which cannot be removed forms in the non-image areas upon inking with a greasy printing ink. These scumming phenomena are caused by baking residues from the layer, which are deposited in the non-image areas. To prevent scumming, it is necessary to coat the imagewise exposed and developed printing plate with a protective layer before baking, which must be removed again after baking. This additional operational step is not required when the binders of the present invention are employed.

By exchanging the binder according to Synthesis 3, as used in Example 1 above, for the corresponding binder according to Synthesis 1 or Synthesis 2, results which were just as good as those described above were obtained with respect to copying and printing technique.

In the following examples further coating solutions are specified, which yielded similar results. The preparation and processing of the printing plates obtained with these coating solutions correspond to the conditions described in Example 1, unless otherwise indicated.

EXAMPLE 2

An electrolytically roughened and anodically oxidized aluminum plate was coated with a solution of
2.00 p.b.w of the esterification product obtained from 1 mole of 2,3,4-trihydroxy-benzophenone and 3 moles of naphthoquinone-(1,2)-diazide-(2)-5-sulfonic acid chloride,
0.20 p.b.w. of naphthoquinone-(1,2)-diazide-(2)-4-sulfonic acid chloride,
3.00 p.b.w. of the condensation product according to Synthesis 7
3.00 p.b.w. of a phenol-formaldehyde novolak comprising 14% of phenolic OH-groups and having a softening range from 110° to 120° C., and
0.12 p.b.w. of crystal violet, in
40 p.b.w. of ethylene glycol monomethyl ether and
60 p.b.w. of tetrahydrofuran.

Before applying the light-sensitive copying layer, the anodically oxidized aluminum support had been treated with an aqueous solution of polyvinylphosphonic acid, as described in German Pat. No. 1,621,478.

EXAMPLE 3

An aluminum plate which had been treated as described in Example 1 was coated with a solution of
2.00 p.b.w. of the esterification product obtained from 1 mole of 2,3,4-trihydroxy-benzophenone and 3 moles of naphthoquinone-(1,2)-diazide-(2)-5-sulfonic acid chloride,
6.00 p.b.w. of the condensation product according to Synthesis 6,
0.20 p.b.w. of naphthoquinone-(1,2)-diazide-(2)-4-sulfonic acid chloride, and
0.12 p.b.w. of crystal violet, in
40.00 p.b.w. of ethylene glycol monomethyl ether and
60.00 p.b.w. of tetrahydrofuran.

The light-sensitive printing plate prepared in this manner was imagewise exposed under a transparent positive original and developed with the solution indicated in Example 1.

EXAMPLE 4

An aluminum plate which had been treated as described in Example 1 was coated with a solution of
2.00 p.b.w. of the esterification product obtained from 1 mole of 2,3,4-trihydroxy-benzophenone and 3 moles of naphthoquinone-(1,2)-diazide-(2)-5-sulfonic acid chloride,
4.00 p.b.w. of the condensation product according to Synthesis 8,
0.20 p.b.w. of naphthoquinone-(1,2)-diazide-(2)-4-sulfonic acid chloride, and
0.12 p.b.w. of crystal violet, in
40.00 p.b.w. of ethylene glycol monomethyl ether and
60.00 p.b.w. of tetrahydrofuran.

The light-sensitive printing plate prepared in this manner was imagewise exposed under a transparent positive original and developed with the solution indicated in Example 1.

EXAMPLE 5

An aluminum plate which had been pre-treated as described in Example 1 was coated with a solution of:
2.00 p.b.w. of the esterification product obtained from 1 mole of 2,3,4-trihydroxy-benzophenone and 3 moles of naphthoquinone-(1,2)-diazide-(2)-5-sulfonic acid chloride,
4.00 p.b.w. of the condensation product according to Synthesis 10,
0.30 p.b.w. of 4-(p-tolylmercapto)-2,5-diethoxybenzenediazoniumhexafluorophosphate, and
0.12 p.b.w. of crystal violet, in
40.00 p.b.w. of ethylene glycol monomethyl ether and
50.00 p.b.w. of tetrahydrofuran.

The light-sensitive printing plate prepared in this manner was imagewise exposed under a transparent positive original and developed with the solution indicated in Example 1.

EXAMPLE 6

An electrolytically roughened and anodically oxidized aluminum plate was coated with a solution of:
2.00 p.b.w. of the esterification product obtained from 1 mole of 2,3,4-trihydroxy-benzophenone and 3 moles of naphthoquinone-(1,2)-diazide-(2)-5-sulfonic acid chloride,
0.20 p.b.w. of naphthoquinone-(1,2)-diazide-(2)-4-sulfonic acid chloride,
3.00 p.b.w. of the condensation product according to Synthesis 5,
3.00 p.b.w. of a phenol-formaldehyde novolak comprising 14% of phenolic OH groups and having a softening range from 110° to 120° C., and
0.12 p.b.w. of crystal violet, in
40.00 p.b.w. of ethylene glycol monomethyl ether and
60.00 p.b.w. of tetrahydrofuran.

Before applying the light-sensitive copying layer, the anodically oxidized aluminum support had been treated with an aqueous solution of polyvinylphosphonic acid, as described in German Pat. No. 1,621,478.

EXAMPLE 7

An aluminum plate which had been pre-treated as described in Example 1, was coated with a solution of:
2.40 p.b.w. of a 50% strength solution of a polyorthoester, prepared from 7,7-bis-hydroxymethyl-5-oxanonan-(1)-ol and trimethylorthoformate, in toluene,
0.20 p.b.w. of 2,4-bis-(trichloromethyl)-6-(4-ethoxynaphth-1-yl)-s-triazine,
5.00 p.b.w. of the condensation product according to Synthesis 2, and
0.035 p.b.w. of crystal violet base in
30.00 p.b.w. of ethylene glycol monomethyl ether and
40.00 p.b.w. of tetrahydrofuran.

The printing plate so prepared was imagewise exposed for 15 seconds under a 5 kW metal halide lamp arranged at a distance of 110 cm and was then developed with a 6% strength aqueous solution of sodium metasilicate.

EXAMPLE 8

An electrochemically roughened and anodically oxidized aluminum plate was coated with a solution of:
0.55 p.b.w. of a polyacetal, prepared from triethylene glycol and 2-ethyl-butyraldehyde,
0.10 p.b.w. of 2-(4-ethoxy-napth-1-yl)-4,6-bis-trichloromethyl-s-triazine, 2.50 p.b.w. of the condensation product according to Synthesis 2, and 0.016 p.b.w. of crystal violet base, in 20.00 p.b.w. of ethylene glycol monomethyl ether and 20.00 p.b.w. of tetrahydrofuran.

The printing plate so prepared was imagewise exposed for 15 seconds under a 5 kW metal halide lamp arranged at a distance of 110 cm and was then developed with an 8% strength aqueous solution of sodium metasilicate.

EXAMPLE 9

An electrolytically roughened and anodically oxidized aluminum plate was coated with a solution of 2.00 p.b.w. of the esterification product obtained from 1 mole of 2,3,4-trihydroxy-benzophenone and 3 moles of naphthoquinone-(1,2)-diazide-(2)-5-sulfonic acid chloride, 0.20 p.b.w. of naphthoquinone-(1,2)-diazide-(2)-4-sulfonic acid chloride, 3.00 p.b.w. of the condensation product according to Synthesis 13, 1.00 p.b.w. of a phenol-formaldehyde novolak comprising 14% of phenolic OH-groups and having a softening range from 110° to 120° C., and 0.12 p.b.w. of crystal violet, in 40.00 p.b.w. of ethylene glycol monomethyl ether and 60.00 p.b.w. of tetrahydrofuran.

Before applying the light-sensitive copying layer, the anodically oxidized aluminum support had been treated with an aqueous solution of polyvinylphosphonic acid, as described in German Pat. No. 1,621,478.

EXAMPLE 10

An electrolytically roughened and anodically oxidized aluminum plate was coated with a solution of:

2.00 p.b.w. of the esterification product obtained from 1 mole of 4-(2-phenyl-prop-2-yl)-phenol and 1 mole of naphthoquinone-(1,2)-diazide-(2)-4-sulfonic acid chloride, 0.20 p.b.w. of naphthoquinone-(1,2)-diazide-(2)-4-sulfonic acid chloride, 4.00 p.b.w. of the condensation product according to Synthesis 11, 0.12 p.b.w. of crystal violet, in 40.00 p.b.w. of ethylene glycol monomethyl ether and 60.00 p.b.w. of tetrahydofuran.

Before applying the light-sensitive copying layer, the anodically oxidized aluminum support had been treated with an aqueous solution of polyvinylphosphonic acid, as described in German Pat. No. 1,621,478.

What is claimed is:

1. Light-sensitive copying material comprising an aluminum support having a surface that is pretreated by being electrochemically roughened and anodically oxidized and a positive-acting, light-sensitive layer provided on said surface, which light-sensitive layer is comprised of (A) an amount of a positive-acting light-sensitive compound sufficient to impart light-sensitivity to said mixture and (B) a binder which is insoluble in water and soluble in aqueous-alkaline solutions, wherein said binder comprises a polycondensation product of (i) a phenol corresponding to the formula

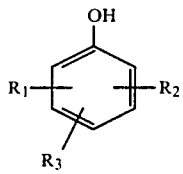

wherein $R_1$ is a hydrogen atom, an alkyl group or a hydroxy group, $R_2$ is a hydrogen atom, an alkyl group, a hydroxy group or an acetyl group, and $R_3$ is a hydrogen atom or a halogen atom, an alkyl group, an alkoxy group, a carboxyl group or a carboxylic acid ester group, and (ii) a compound corresponding to the formula $$ROCH_2—X—CH_2OR,$$

wherein

R is a hydrogen atom, a methyl group, an ethyl group or an acetyl group and

X is a phenylene group or a divalent aromatic group which comprises two phenylene groups linked by (a) a single bond, (b) an ether group, (c) a sulfide group, (d) a sulfone group, or (e) an alkylene group, and which may be unsubstituted or substituted.

2. A light-sensitive copy material as claimed in claim 1, wherein said phenol is a monohydric phenol wherein at least one from the group consisting of an o-position and the p-position of said phenol is occupied.

3. A light-sensitive copy material as claimed in claim 1, wherein said polycondensation product comprises at least three units of said phenol.

4. A light-sensitive copy material as claimed in claim 1, wherein X is a group corresponding to the formula

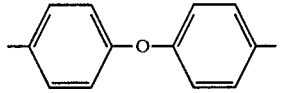

5. A light-sensitive copy material as claimed in claim 1, or claim 3, wherein R is a methyl group.

6. A light-sensitive copy material as claimed in claim 5, wherein X is a radical of one selected from the group consisting of a diphenylether, a diphenylsulfide, a diphenyl, a diphenylmethane, and a diphenylsulfone, said radical being substituted or unsubstituted.

7. A light-sensitive copy material as claimed in claim 1, wherein X is a radical of a diphenylalkane which comprises an alkane group having 1 to 6 carbons.

8. A light-sensitive copy material as claimed in claim 1, which contains a 1,2-quinone diazide as a light-sensitive compound.

9. A light-sensitive copy material as claimed in claim 1, comprising as said light-sensitive combination of compounds (A) a compound having at least one C—O—C bond which can be split by acid and (B) a compound which eliminates a strong acid upon exposure.

10. A light-sensitive copy material as claimed in claim 1, wherein said polycondensation product is present in a quantity ranging between about 10 and 95% by weight, relative to the mixture of non-volatile constituents in said mixture.

11. A light-sensitive copy material as claimed in claim 10, wherein said quantity ranges between about 40 and 80% by weight.

12. Copying material as claimed in claim 1, wherein said polycondensation product is produced by a process comprising the steps of
   (a) dissolving 2-methyl-resorcinol in 4,4'-bis-(methoxymethyl)-diphenylether to form a solution,
   (b) adding to said solution a condensing agent such that condensation occurs with increasing temperature in said solution, and thereafter
   (c) obtaining said polycondensation product as a precipitate from said reaction solution.

13. Copying material as claimed in claim 12, wherein said condensing agent is selected from the group consisting of diethylsulfate, methane sulfonic acid and phosphorous oxychloride.

14. Copying material as claimed in claim 13, wherein the condensing agent is methane sulfonic acid.

15. Copying material as claimed in claim 13, wherein the condensing agent is diethylsulfate.

16. Copying material as claimed in claim 12, wherein said solution comprises a solvent in addition to 4,4'-bis-(methoxymethyl)-diphenylether.

17. Copying material as claimed in claim 16, wherein said solvent is selected from the group consisting of 1,2-dimethoxyethane, dioxane and xylene.

18. Copying material as claimed in claim 17, wherein said solvent is 1,2-dimethoxyethane.

19. Copying material as claimed in claim 1, wherein said polycondensation product is comprised of 2-methyl-resorcinol and 4,4'-bis-(methoxymethyl)diphenylether.

* * * * *